US010362700B2

(12) United States Patent
Pasquier et al.

(10) Patent No.: US 10,362,700 B2
(45) Date of Patent: Jul. 23, 2019

(54) AIRCRAFT TURBOMACHINE COMPUTER

(71) Applicant: SAFRAN POWER UNITS, Toulouse (FR)

(72) Inventors: Ludovic Pasquier, Bruguieres (FR); Daniel Averous, Mont Joire (FR); Remi Joachim, Dremil-Lafage (FR)

(73) Assignee: SAFRAN POWER UNITS, Toulouse (FR)

( * ) Notice: Subject to any disclaimer, the term of this patent is extended or adjusted under 35 U.S.C. 154(b) by 0 days.

(21) Appl. No.: 14/441,882

(22) PCT Filed: Nov. 12, 2013

(86) PCT No.: PCT/FR2013/052701
§ 371 (c)(1),
(2) Date: May 11, 2015

(87) PCT Pub. No.: WO2014/076400
PCT Pub. Date: May 22, 2014

(65) Prior Publication Data
US 2015/0296650 A1 Oct. 15, 2015

(30) Foreign Application Priority Data
Nov. 13, 2012 (FR) ...................................... 12 60800

(51) Int. Cl.
H05K 7/14 (2006.01)
F01D 21/02 (2006.01)
(Continued)

(52) U.S. Cl.
CPC ............ H05K 7/1417 (2013.01); F01D 21/02 (2013.01); F01D 21/045 (2013.01); F02C 9/46 (2013.01);
(Continued)

(58) Field of Classification Search
CPC ...... H05K 7/1417; H05K 5/04; H05K 7/1402; H05K 7/1422; H05K 7/1461;
(Continued)

(56) References Cited

U.S. PATENT DOCUMENTS 5,550,710 A * 8/1996 Rahamim ............. G06F 1/1632
361/679.33
5,555,159 A * 9/1996 Dore ..................... H05K 7/1432
361/736

(Continued)

FOREIGN PATENT DOCUMENTS

EP 1 296 045 3/2003
EP 1 296 047 3/2003

(Continued)

OTHER PUBLICATIONS

U.S. Appl. No. 14/441,668, filed May 8, 2015, Pasquier et al.

(Continued)

Primary Examiner — Jerry Wu
Assistant Examiner — Stephen S Sul
(74) Attorney, Agent, or Firm — Oblon, McClelland, Maier & Neustadt, L.L.P.

(57) ABSTRACT

An aircraft turbomachine calculator including a parallelepiped metal casing including an electronic circuit wherein a control channel and a monitoring channel are integrated. The casing includes a first cavity wherein a first electronic board is provided for managing the control channel and a second cavity, independent of the first cavity, wherein a second electronic board is provided for managing the monitoring channel, these electronic boards being provided in two planes oriented with respect to each other at an angle of 90°.

13 Claims, 3 Drawing Sheets

(51) Int. Cl.
*H05K 5/04* (2006.01)
*F01D 21/04* (2006.01)
*F02C 9/46* (2006.01)

(52) U.S. Cl.
CPC ........... *H05K 5/04* (2013.01); *F05D 2270/09* (2013.01); *Y02T 50/671* (2013.01)

(58) Field of Classification Search
CPC ...... H05K 7/1452; H05K 1/145; H05K 1/144; H05K 2201/042; H05K 2201/043; H05K 3/0097; H05K 5/0021; F02C 9/46; F01D 21/045; F01D 21/02; Y02T 50/671; F05D 2270/09; G06F 1/1601; G06F 1/184; G06F 15/161
USPC .................................. 361/796, 809, 810, 729
See application file for complete search history.

(56) References Cited

U.S. PATENT DOCUMENTS

| | | |
|---|---|---|
| 2003/0056491 A1 | 3/2003 | Coleman et al. |
| 2003/0056494 A1* | 3/2003 | Coleman ................ F01D 25/26 60/239 |
| 2005/0032398 A1* | 2/2005 | Perret .................... H05K 1/147 439/67 |
| 2005/0181643 A1* | 8/2005 | Brower ................... H04L 67/02 439/76.1 |
| 2007/0086274 A1* | 4/2007 | Nishimura ............. H04B 11/00 367/140 |
| 2007/0141883 A1* | 6/2007 | Bulcea .................... G06F 1/188 439/215 |
| 2007/0297727 A1* | 12/2007 | Ueno ................... G02B 6/3604 385/93 |
| 2011/0125385 A1* | 5/2011 | Eichenseher ......... F02D 41/266 701/102 |
| 2013/0013935 A1* | 1/2013 | Haukom ................ G01C 23/00 713/300 |

FOREIGN PATENT DOCUMENTS

| | | |
|---|---|---|
| FR | 2 960 912 | 12/2011 |
| FR | 2 965 698 | 4/2012 |

OTHER PUBLICATIONS

French Search Report dated Aug. 6, 2013 in French Patent Application No. 1260800 Filed Nov. 13, 2012.
International Search Report dated Jan. 21, 2014 in PCT/FR2013/052701 Filed Nov. 12, 2013.

* cited by examiner

AIRCRAFT TURBOMACHINE COMPUTER

TECHNICAL FIELD

The invention relates to a turbomachine calculator, for example an Auxiliary Power Unit (APU), aboard an aircraft, for example a helicopter.

STATE OF PRIOR ART

The field of the invention is that of aircraft turbomachines, in particular that of aircraft turbomachine calculators used to regulate the behavior of these turbomachines. Such calculators can gather in a same casing a regulation channel and a monitoring or overspeed protection channel, which allows to obtain a cheaper cost and a lower mass than a solution wherein these channels would be set in two separated casings.

The regulation channel has the function to regulate the turbomachine speed. But a failure of this regulation channel can cause an overspeed of the turbine shaft. Indeed, when this shaft is breaking, the power provided by gases to the turbine is no longer absorbed by the equipment driven by this shaft and the rotational speed of the turbine increases extremely quickly. Such an overspeed results very quickly in breaking the turning parts and/or the separation thereof from the turbine disk. These turning parts are then violently outwardly projected because of the centrifugal force and can pass through the case surrounding the turbine, causing very significant damage in the engine, and able to put the aircraft and its passengers at risk.

The overspeed protection channel has the object to avert the consequences of such an overspeed. The overspeed protection channel includes an electronic member associated with a hydromechanical member. The electronic member measures the rotational speed of the rotor. If the electronic member detects an overspeed, it then controls the hydromechanical member, which cuts off the fuel supply to the turbomachine.

The invention has the object to provide a solution to a technical problem difficult to be solved which is that of a common mode failure, that is both a failure of the regulation channel and a failure of the overspeed protection channel, in particular those due to an origin external to the calculator (so-called "local events").

DISCLOSURE OF THE INVENTION

The invention relates to an aircraft turbomachine calculator, comprising a parallelepiped metal casing containing an electronic circuit wherein a control channel and a monitoring channel are integrated, characterized in that the casing comprises a first cavity wherein a first electronic board is provided for managing the control channel and a second cavity, independent of the first cavity, wherein a second electronic board is provided for managing the monitoring channel, these electronic boards being provided in two planes oriented with respect to each other at an angle of 90°.

Advantageously, each board is connected to at least one connector located on a face of the casing. Each connector can be a multipin connector.

Advantageously, the calculator of the invention comprises a third electronic board provided in the first cavity, this third board being electrically connected to the first electronic board.

Advantageously, the first and second electronic boards are galvanically isolated from each other. The first and second electronic boards can thus be connected to each other by an optical link.

Advantageously, the casing is made of aluminum or titanium. It can have a width between 10 and 40 cm, typically 30 cm, a height between 10 and 30 cm, typically 10 cm and a thickness between 3 and 10 cm, typically 5 cm.

The calculator of the invention can be a calculator of an Auxiliary Power Unit (APU). The invention can relate to an aircraft, for example a helicopter, implementing such a calculator.

BRIEF DESCRIPTION OF THE DRAWINGS

FIGS. 1 and 2 are isometric exploded views, FIG. 3 being a front view and FIG. 4 a cross section view along the line A-A, the broken line A-A being represented in FIG. 3.

DETAILED DISCLOSURE OF PARTICULAR EMBODIMENTS

Figure 1:
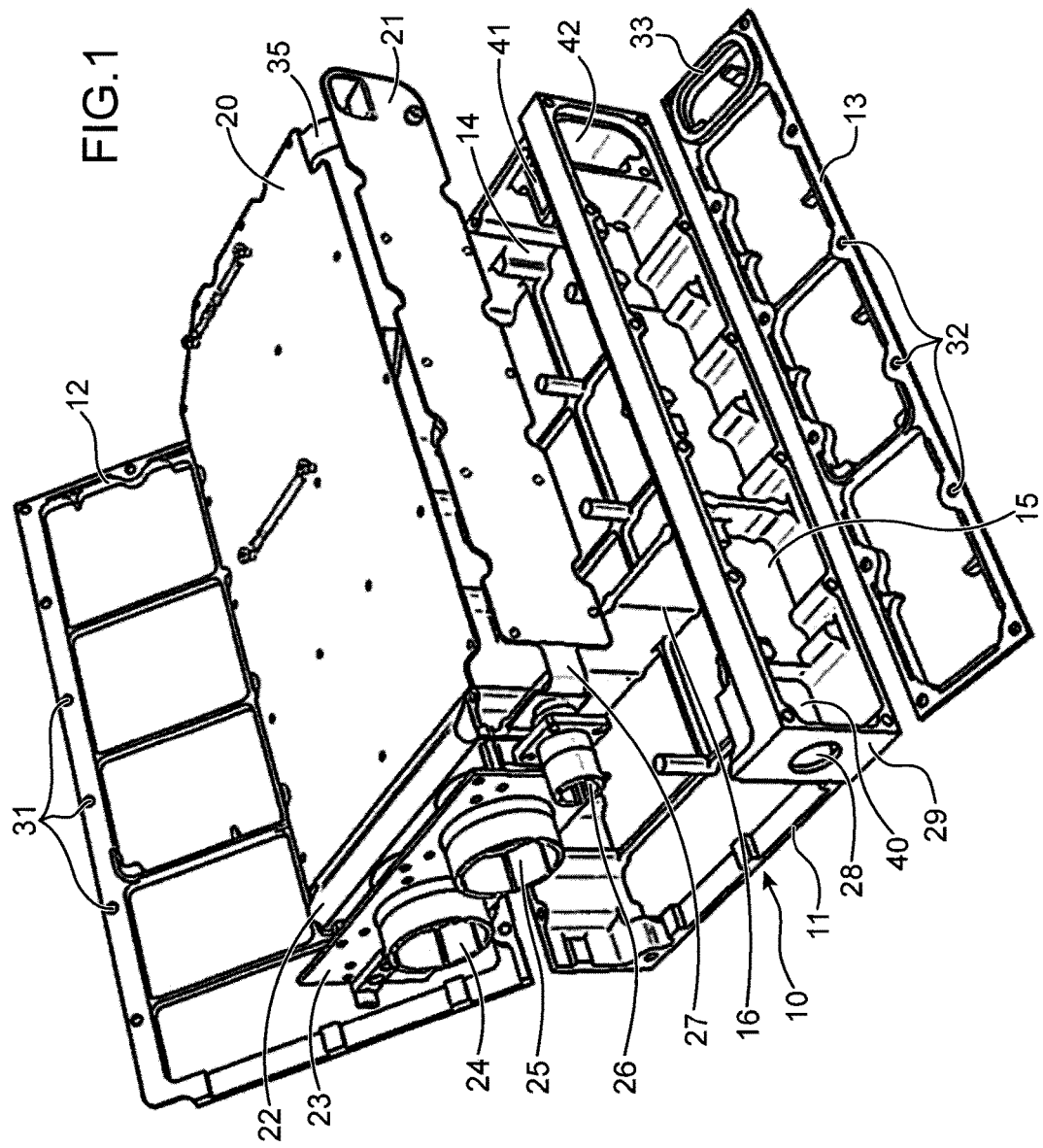
FIGS. 1 to 4 illustrate the aircraft turbomachine calculator according to the invention.
Figure 2:
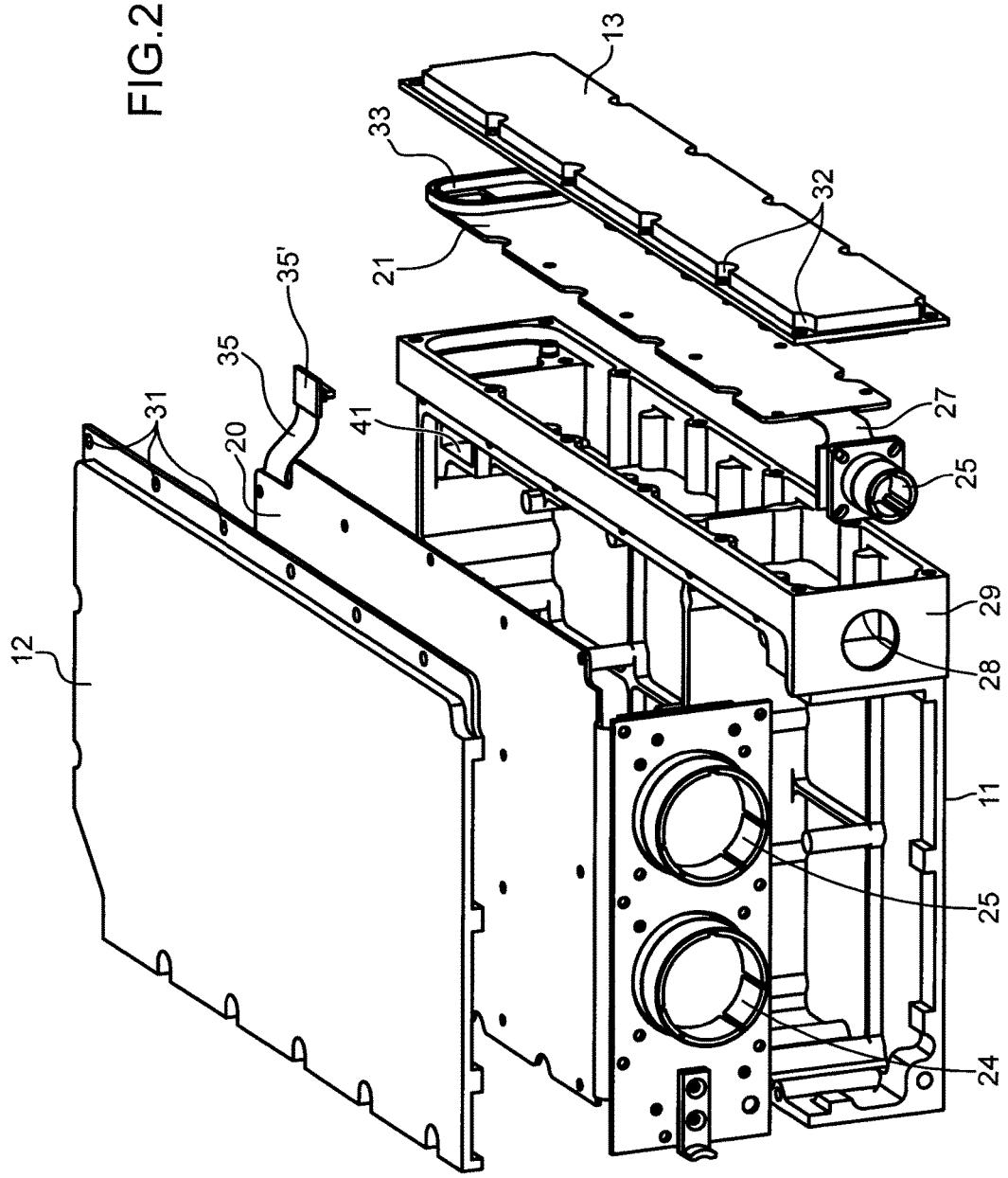

The aircraft turbomachine calculator of the invention comprises a parallelepiped metal casing 10 containing independent first and second parallelepiped cavities 14 and 15 wherein a first and a second electronic boards 20 and 21 are respectively provided wherein a control channel and a monitoring channel are respectively integrated. These boards are provided in two planes oriented with respect to each other to form a determined angle, for example 90°.

As illustrated in FIGS. 1 to 4, the casing 10 consists of a parallelepiped mount 11 and two covers 12 and 13 which are respectively attached to the upper face and a side face of the mount 11 to form two independent parallelepiped cavities 14 and 15. The covers 12 and 13 can be attached by screwing onto the mount 11, through holes 31 and 32, wherein seals 33 can be provided in interstitial spaces.

The first cavity 14 divided into two by a wall 16 is designed to receive the first electronic board 20 for managing the control channel. The second cavity 15 is designed to receive the second electronic board 21 for managing the monitoring channel.

Figure 4:
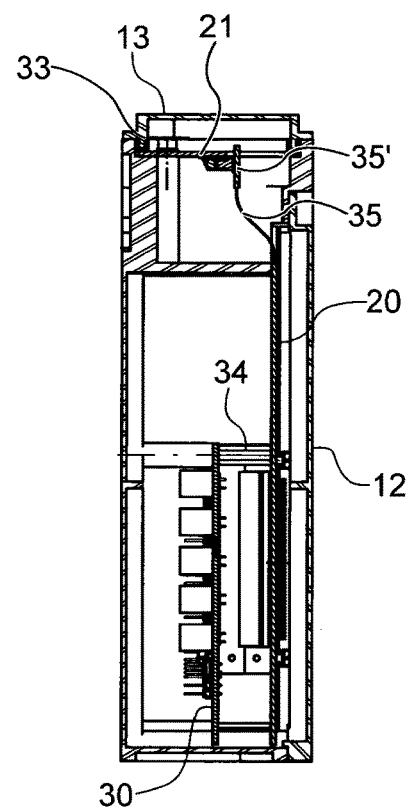

The first cavity 14 can also contain a third electronic board 30, provided in the bottom of the first cavity 14 as illustrated in FIG. 4, that can be electrically connected to the first board 20 by pin connectors. Such a third electronic board 30 therefore has the object to operationally complete the first electronic board.

The first electronic board 20 is connected by a flexible conductor 22 to a small board 23, wherein two multipin connectors 24 and 25 are attached, and which fits into the front part of the mount 11. The second electronic board 21 is connected to a multipin connector 26 by a flexible conductor 27. This connector 26 is attached in an aperture 28 provided on the front part of the mount 11.

As represented in FIG. 4, spacers 34 enable the first electronic board 20 to be spaced apart from the third electronic board 30.

The first electronic board is connected to the second electronic board by a flexible conductor 35 ending with a connector 35' ensuring a galvanic link, this conductor being intended to pass through the aperture 42 made in the mount 11. The partition walls 40 and 41 between the first cavity 14 and the second cavity ensure their independency.

The calculator of the invention is thus comprised of two electronic boards 20 (possibly completed by the third board 30) and 21 accommodated into two independent volumes, oriented at a determined angle with respect to each other, advantageously, at an angle of 90° ensuring the absence of a vibratory type failure common mode. Both these volumes ensure the absence of a physical, thermodynamical, chemical, electric . . . type failure common mode.

Such a solution facilitates accommodating independent connectors for each board. It also facilitates the use of two independent power supplies.

Figure 3:
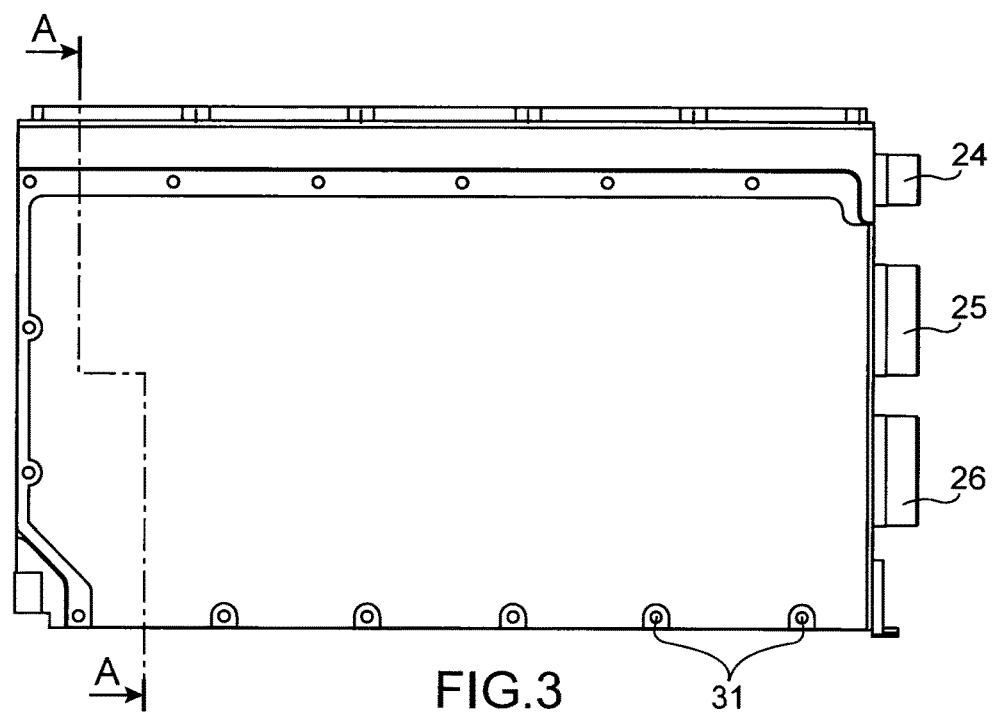

In an advantageous embodiment, the calculator has the dimensions represented in FIGS. 3 and 4 (figures at the 1:1 scale).

Both electronic boards 20 and 21 are connected to each other by a minimalized interface ensured for example by opto-couplers ensuring the electrical independency of the two control and safety channels.

The calculator of the invention enables all the common causes of breakdowns to be eliminated, by allowing a great flexibility:

The external manufacture of one of the electronic boards 20 (30) and 21 enables the common manufacture causes to be solved.

The sealing between both cavities 14 and 15 enables the common thermodynamic causes of mutual heating or exposure to a simultaneous over-temperature of the electronic boards 20 (30) and 21 to be solved.

The sealing between both cavities 14 and 15 enables the common physicochemical or exposure to a mechanical risk causes to be solved. The risk of run off on the electronic boards 20 (30) and 21 is solved. The risk of using a screw which causes a simultaneous short circuit is solved.

The independency of the cavities 14 and 15 allows a high electrical insulation of the electronic boards 20 (30) and 21 by avoiding cascade electric breakdowns from one board to the other, these breakdowns can be related to the lightning strike, to the electric supply variations by the electrical network.

The perpendicular arrangement of the electronic boards 20 (30) and 21 solves the mechanical resonances by modifying the exposure to vibration and ensures a non-simultaneous breaking of these boards.

An electrical problem existing on an electronic board 20 (30) does not electrically propagate to the other board 21.

A breakdown of the link between the electronic boards has the only impact to put the calculator into safety: the monitoring channel turns off the calculator or prevents it from being booted.

The invention claimed is:

1. An aircraft turbomachine calculator comprising:
a parallelepiped metal casing comprising a single mount, a first cavity and a second cavity, the first cavity and the second cavity being sealed with respect to each other; and
an electronic circuit comprising a first electronic board configured for managing an aircraft turbomachine control channel, and a second electronic board configured for managing an aircraft turbomachine monitoring channel, the second electronic board being separate from the first electronic board,
wherein the first electronic board is arranged in the first cavity, the first electronic board extending in a first plane,
wherein the second electronic board is arranged in the second cavity, the second electronic board extending in a second plane,
wherein the first electronic board and the second electronic board are permanently oriented with respect to each other at an angle of 90°, and
wherein the first cavity and the second cavity are airtight.

2. The calculator according to claim 1, wherein each electronic board is connected to at least one connector located on a face of the casing.

3. The calculator according to claim 2, wherein each connector is a multipin connector.

4. The calculator according to claim 1, further comprising a third electronic board provided in the first cavity, the third electronic board being electrically connected to the first electronic board.

5. The calculator according to claim 1, wherein the first and second electronic boards are galvanically isolated from each other.

6. The calculator according to claim 5, wherein the first and second electronic boards are connected to each other by an optical link.

7. The calculator according to claim 1, wherein the casing is made of aluminum or titanium.

8. The calculator according to claim 1, wherein the casing has a width between 10 and 40 cm, a height between 10 and 30 cm, and a thickness between 3 and 10 cm.

9. An aircraft comprising a calculator according to claim 1.

10. The calculator according to claim 1, wherein a partition is provided between the first cavity and the second cavity such that the first cavity and the second cavity are sealed relative to one another.

11. An aircraft turbomachine calculator, comprising:
a parallelepiped metal casing comprising a single mount, a first cavity and a second cavity, the first cavity and the second cavity being sealed in relation to each other; and
an electronic circuit comprising a first electronic board configured for managing an aircraft turbomachine control channel, and a second electronic board configured for managing an aircraft turbomachine monitoring channel, the second electronic board being mechanically independent from the first electronic board,
wherein the first electronic board is arranged in the first cavity, the first electronic board extending in a first plane,
wherein the second electronic board is arranged in the second cavity, the second electronic board extending in a second plane,
wherein the first electronic board and the second electronic board are permanently oriented with respect to each other at an angle of 90°, and
wherein the first cavity and the second cavity are airtight.

12. The calculator according to claim 11, wherein a partition is provided between the first cavity and the second cavity such that the first cavity and the second cavity are sealed relative to one another.

13. An aircraft turbomachine calculator comprising:
a parallelepiped metal casing defined by six faces including a first face and a second face, the casing comprising a first cavity on the first face and a second cavity on the second face, the first cavity and the second cavity being sealed with respect to each other; and
an electronic circuit comprising a first electronic board configured for managing an aircraft turbomachine control channel, and a second electronic board configured for managing an aircraft turbomachine monitoring channel, the second electronic board being separate from the first electronic board, wherein the first electronic board is arranged in the first cavity, wherein the second electronic board is arranged in the second cavity, and wherein the first face and the second face are permanently oriented with respect to each other at an angle of 90°.

* * * * *